United States Patent
Tay et al.

[11] Patent Number: 6,075,922
[45] Date of Patent: Jun. 13, 2000

[54] PROCESS FOR PREVENTING GAS LEAKS IN AN ATMOSPHERIC THERMAL PROCESSING CHAMBER

[75] Inventors: Sing Pin Tay, Fremont; Yao Zhi Hu, San Jose, both of Calif.; Yuval Wasserman, Gaithersburg, Md.

[73] Assignee: Steag RTP Systems, Inc., San Jose, Calif.

[21] Appl. No.: 08/908,228

[22] Filed: Aug. 7, 1997

[51] Int. Cl.[7] .............................. A21B 2/00; F26B 19/00
[52] U.S. Cl. ............................................. 392/416; 392/418
[58] Field of Search ....................................... 392/416, 418; 219/405, 411, 390; 118/724, 725, 50.1; 432/152; 438/795; 427/557, 559

[56] References Cited

U.S. PATENT DOCUMENTS

| | | |
|---|---|---|
| 4,762,576 | 8/1988 | Wilson et al. . |
| 4,986,216 | 1/1991 | Ohmori et al. . |
| 5,315,092 | 5/1994 | Takahashi et al. . |
| 5,443,997 | 8/1995 | Tsui et al. . |
| 5,445,699 | 8/1995 | Kamikawa et al. . |
| 5,455,082 | 10/1995 | Saito et al. ........................ 427/452 |

*Primary Examiner*—Teresa Walberg
*Assistant Examiner*—Shawntina T. Fuqua
*Attorney, Agent, or Firm*—Dority & Manning, P.A.

[57] ABSTRACT

A process and system for preventing gases from either leaking into or out of a thermal processing chamber that is designed to operate at or near atmospheric pressure is disclosed. For instance, in one embodiment, gases are prevented from leaking into a thermal processing chamber by maintaining the pressure within the chamber at levels that are slightly greater than atmospheric pressure. In an alternative embodiment, in order to prevent gases from leaking out of the chamber, the pressure within the chamber is maintained at levels slightly less than atmospheric pressure. During operation of the thermal processing chamber, a gas is continuously circulated through the chamber. In order to carry out the process of the present invention, a pressure control device can be placed upon the gas outlet for maintaining the pressure within the chamber within a desired range.

26 Claims, 1 Drawing Sheet

PROCESS FOR PREVENTING GAS LEAKS IN AN ATMOSPHERIC THERMAL PROCESSING CHAMBER

FIELD OF THE INVENTION

The present invention is generally directed to a method for preventing gaseous leaks into and out of thermal processing chambers that operate at or near atmospheric pressure. The thermal processing chambers, for instance, are used to heat treat semiconductor wafers and to fabricate semiconductor devices. According to the present invention, gases are prevented from leaking into or out of the thermal processing chamber by carefully controlling the pressure within the chamber.

BACKGROUND OF THE INVENTION

A thermal processing chamber, as used herein, refers to a device that uses light energy to heat objects, such as semiconductor wafers. Such devices typically include a substrate holder for holding a semiconductor wafer and a light source that emits light energy for heating the wafer. For monitoring the temperature of the semiconductor wafer during heat treatment, thermal processing chambers also typically include radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy.

One type of thermal processing chamber operates at or near atmospheric pressure. These types of processing chambers typically include a gas inlet and a gas outlet for continuously circulating a gas through the chamber during processing of semiconductor wafers. The gas that is circulated through the chamber can be, for instance, an inert gas for preventing the semiconductor wafer from undergoing any adverse chemical reactions during the heating process. Alternatively, the gas circulated through the chamber can contain a gaseous reactant which reacts with the surface of a semiconductor wafer to form a film or coating on the wafer in fabricating a semiconductor device.

In the past, problems have been experienced in the operation of the above-described atmospheric thermal processing chambers due to gas leaks present in the chamber walls. For instance, it is not uncommon for leaks to develop around the movable doors that are used to insert and remove the semiconductor wafers and around various fittings and spectral windows that may be present on the chamber. It has been found to be expensive and impractical to locate the leaks and/or to leak test the chamber itself. For instance, in order to leak test a chamber, the chamber must be taken off line and the process being conducted in the chamber must be stopped.

Many adverse consequences can result should a substantial amount of gases leak into or out of the thermal processing chamber during operation. For instance, one major concern is the infiltration of oxygen from the outside environment into the chamber during some applications. In particular, oxygen can adversely react with a gas being fed to the chamber, can react with the semiconductor wafer, or can otherwise adversely interfere with the process. Besides oxygen, it is also important that substantial amounts of moisture do not leak into the thermal processing chamber either.

In other applications, it is important that none of the gases being fed to the chamber are permitted to escape from the chamber into the outside atmosphere. For instance, during some applications, the gases that are used to react with the semiconductor wafer are hazardous to the environment or are toxic.

Problems experienced with gases either leaking into or out of atmospheric thermal processing chambers have been further magnified in the past due to the exhaust systems that have been connected to the chambers. For instance, atmospheric thermal processing chambers, when installed at a particular facility, are typically connected at the gas outlet to a preexisting exhaust system present at the facility. Such exhaust systems, which can vary from site to site, are usually connected to various different equipment and machinery. Thus, the exhaust systems can undergo large fluctuations in pressure depending upon the particular circumstances. Such fluctuations can have a direct impact on the pressure within the thermal processing chamber and the rate at which gases flow through the chamber. The pressure in a thermal processing chamber and the exhaust rate have a direct impact, in turn, on the amount of gases that may leak into or out of the chamber.

In the past, atmospheric thermal processing chambers typically did not contain any controls that normalized the exhaust rate of the gases out of the chamber or compensated for the exhaust system that was connected to the chamber. Further, little was done to prevent gas leakage into or out of the chamber.

Thus, a need exists for a method that minimizes the amount of gases that leak into an atmospheric thermal processing chamber. Similarly, a need also exists for a method that prevents process gases from leaking out of the chamber during operation. Such controls are especially necessary due to the increasing demands that are being placed upon the preciseness at which semiconductor wafers are heat treated and at which semiconductor devices are fabricated. Consequently, there is currently a need to develop more precise control over the process parameters of thermal processing chambers in order to better control the heat treating process and the deposition of films on semiconductor wafers.

SUMMARY OF THE INVENTION

The present invention recognizes and addresses the foregoing disadvantages, and others of prior art constructions and methods.

Accordingly, it is an object of the present invention to provide an improved process for processing semiconductor wafers in thermal processing chambers that are designed to operate at or near atmospheric pressure.

It is another object of the present invention to provide a process for preventing atmospheric gases from leaking into an atmospheric thermal processing chamber.

It is another object of the present invention to also provide a method for preventing processing gases from leaking out of a thermal processing chamber.

Still another object of the present invention is to provide a substantially leak proof atmospheric thermal processing chamber that includes a pressure control device.

Another object of the present invention is to provide a method for preventing atmospheric gases from leaking into a thermal processing chamber by maintaining the chamber at a pressure that is slightly greater than atmospheric pressure.

Another object of the present invention is to provide a method for preventing gases from leaking out of a thermal processing chamber by maintaining the chamber at a pressure that is slightly less than atmospheric pressure.

These and other objects of the present invention are achieved by providing a process for preventing atmospheric gases from leaking into a thermal processing chamber. The process includes the steps of placing a semiconductor wafer in a thermal processing chamber for heat treating the wafer. Once placed inside the chamber, the semiconductor wafer is subjected to light energy which heats the wafer during the process. During the process, a gas continuously flows through the chamber entering a gas inlet and exiting through a gas outlet.

In accordance with the present invention, the pressure within the thermal processing chamber is maintained at a level that is slightly greater than the pressure of the atmosphere outside the thermal processing chamber. In particular, the pressure within the chamber is maintained at a level of up to about 5 mm Hg of pressure greater than the atmospheric pressure. For instance, the thermal processing chamber can be maintained at a pressure that is from about 0.5 mm Hg to about 3 mm Hg greater than atmospheric pressure, and more particularly from about 0.5 mm Hg to about 1.5 mm Hg greater than the atmospheric pressure. For instance, if atmospheric pressure is 760 mm Hg, the thermal processing chamber is maintained at a pressure of from about 760.5 mm Hg to about 763 mm Hg, and more particularly at a pressure of from about 760.5 mm Hg to about 761.5 mm Hg. By maintaining a slightly greater amount of pressure within the chamber, atmospheric gases are substantially prevented from entering the chamber through any leaks that may be present in the chamber walls.

In one embodiment, for carrying out the process of the present invention, the thermal processing chamber includes a pressure control device, such as a throttle valve, in communication with the gas outlet. The pressure control device is for controlling the pressure within the chamber by regulating the amount of gas exiting the chamber. The pressure control device can be in communication with a pressure gauge and a controller. The controller can receive information from the pressure gauge and, based on the information, automatically adjust the pressure control device from maintaining the pressure within the thermal processing chamber within a desired range. The controller, for instance, can be a microprocessor.

The gas that continuously flows through the chamber can be, for instance, an inert gas, such as nitrogen. In an alternative embodiment, the gas can contain a gaseous reactant which reacts with the semiconductor wafer.

These and other objects of the present invention are also achieved by providing a process for preventing gases from escaping from a thermal processing chamber. In this embodiment, a semiconductor wafer is first placed in a thermal processing chamber and heated using light energy. While the wafer is being heated, a gas is continuously circulated through the chamber.

In accordance with the present invention, in order to prevent any of the gases flowing through the chamber from being released into the atmosphere, a pressure is maintained within the chamber that is slightly less than the pressure of the atmosphere outside the chamber. Specifically, the pressure within the chamber is maintained at a level of up to about 5 mm Hg less than atmospheric pressure. For instance, the pressure within the chamber can be maintained within a range from about 0.5 mm Hg to about 3.0 mm Hg less than atmospheric pressure, and particularly in an amount from about 0.5 mm Hg to about 1.5 mm Hg less than atmospheric pressure.

Similar to the embodiment described above, in order to prevent gases from leaking out of the chamber, the chamber can include a pressure control device. The pressure control device, for instance, can be placed in communication with the gas outlet for controlling the pressure within the chamber at a desired level. The pressure control device can be connected to a controller which monitors the pressure within the chamber and automatically adjusts the pressure control device.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
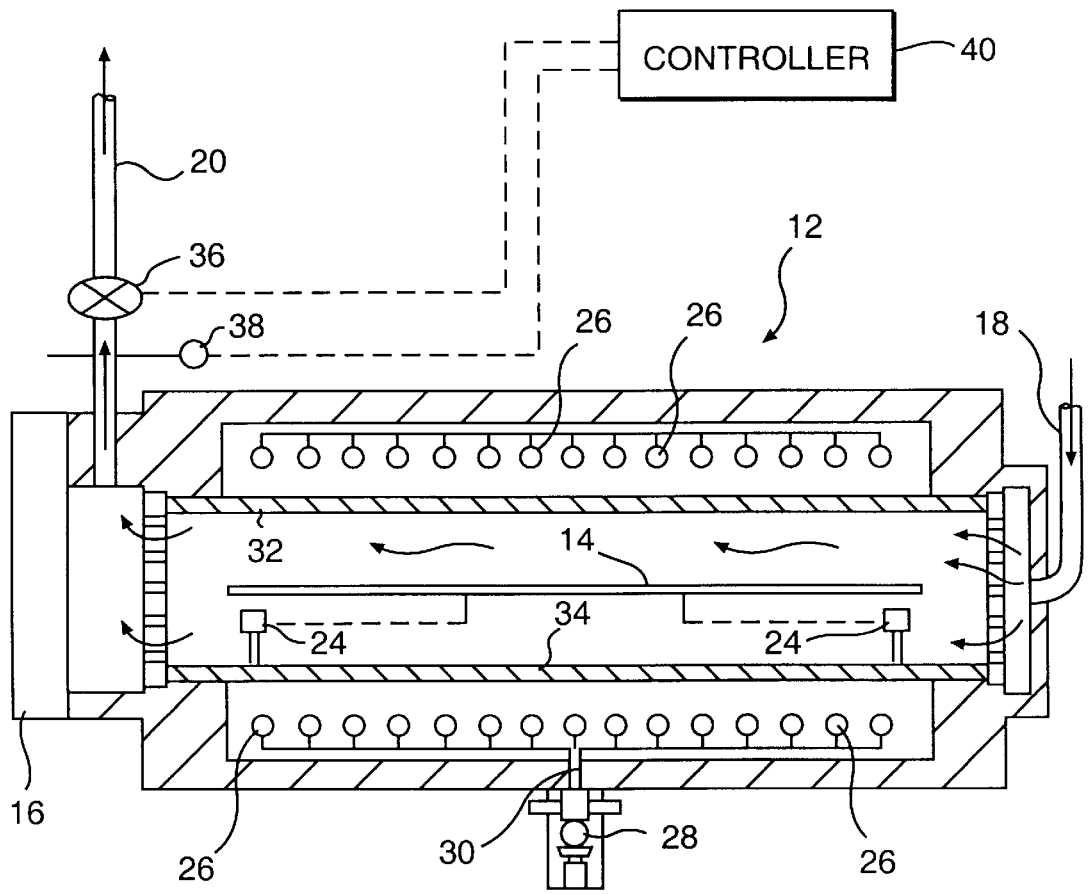
FIG. 1 is a cross sectional view of one embodiment of a thermal processing chamber designed to carry out the process of the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a system and a process for preventing gases from either leaking into or out of a thermal processing chamber that is designed to operate at or near atmospheric pressure. More particularly, these types of processing chambers typically include a gas inlet and a gas outlet through which a gas is continuously circulated during operation of the chamber. The gas is used either to prevent any unwanted reactions from occurring during the processing of semiconductor wafers or is added to the chamber in order to react with a semiconductor wafer for depositing a film or coating on the wafer.

As described above, in the past, these types of thermal processing chambers have experienced problems with gases either leaking into or out of the chamber during operation. Unwanted gases that leak into the chamber can create unwanted chemical reactions in the chamber or can otherwise adversely interfere with the process being performed in the chamber. Gases leaking out of the chamber, on the other hand, during some applications can be hazardous to the environment or toxic. In the past, it has been very difficult not only to detect any leaks that may be present within the chamber but also to repair leaks once they have formed. Further, problems with gases either leaking into or out of thermal processing chambers have been compounded due to pressure fluctuations occurring in exhaust systems that have been connected to these chambers.

The present invention is directed to preventing gases from leaking into or, alternatively, from leaking out of atmospheric thermal processing chambers by carefully controlling the pressure within the chamber during operation. Specifically, according to the present invention, the pressure within the chamber is controlled and maintained within a preset range regardless of conditions that may exist in the exhaust that is connected to the chamber. Controlling the pressure within the thermal processing chamber also compensates for any leaks that may be present within the chamber walls. In other words, the process of the present invention prevents gases from either leaking into or out of the thermal processing chamber without having to either detect or repair any leaks that may exist within the chamber.

For instance, in one embodiment, the present invention is directed to a process designed to prevent atmospheric gases from leaking into a thermal processing chamber that operates at or near atmospheric pressure. Of particular concern, the process of the present invention prevents oxygen and moisture that may be present in the atmosphere from infiltrating the chamber and adversely affecting any operations being carried out in the chamber. Specifically, according to the present invention, atmospheric gases are prevented from leaking into the thermal processing chamber by maintaining the pressure within the chamber at a level that is slightly greater than atmospheric pressure. By maintaining a pressure differential between the inside of the chamber and the outside atmosphere, it has been discovered that gases are significantly prevented from entering the chamber through any leaks that may be exist in the chamber.

For example, in order to prevent any gases from leaking into the chamber, the pressure within the chamber can be maintained at a level that is up to about 5 mm Hg greater than atmospheric pressure, and particularly at a level that is from about 0.5 mm Hg to about 3.0 mm Hg greater than atmospheric pressure. For example, in one preferred embodiment of the present invention, the pressure is maintained at a level that is from about 0.5 mm Hg to about 1.5 mm Hg greater than the pressure of the atmosphere surrounding the chamber.

It has been discovered that even the slightest pressure differential will prevent gases from leaking into the chamber. Maintaining the pressure within the chamber at a level greater than 5 mm Hg will also prevent gases from leaking into the chamber but will not provide any significant improvements in inhibiting gases from leaking in over smaller pressure differences. Further, maintaining a greater than 5 mm Hg pressure differential may interfere with the process being carried out in the thermal processing chamber, which is designed to operate near atmospheric pressure.

Besides preventing gases from leaking into the chamber, in an alternative embodiment, the process of the present invention is also directed to a process for preventing gases from leaking out of the chamber. This embodiment of the present invention is particularly applicable to situations where a hazardous or toxic gas is fed to the chamber during operation. In some applications, such gases are fed to the chamber in order to produce a desirable reaction with a semiconductor wafer or semiconductor device that is being heat treated within the chamber.

In this embodiment of the present invention, in order to prevent gases from leaking out of the chamber, the pressure within the chamber is maintained at a level that is slightly less than the atmospheric pressure. For example, the pressure can be maintained within the thermal processing chamber at a level that is about 5 mm Hg less than the pressure of the atmosphere surrounding the chamber. For instance, the pressure within the chamber can be maintained at a level from about 0.5 mm Hg to about 3.0 mm Hg less than atmospheric pressure, and more particularly, from about 0.5 mm Hg to about 1.5 mm Hg less than atmospheric pressure. Maintaining the pressure within the thermal processing chamber at a level that is slightly less than atmospheric pressure prevents gases contained within the chamber from escaping into the atmosphere without adversely interfering with the process being performed within the chamber.

In the past, atmospheric thermal processing chambers were typically not equipped with any types of control mechanisms for preventing gases from either leaking into or out of the chamber. As a result, the accuracy of prior art devices in heat treating semiconductor wafers or fabricating semiconductor devices was limited. The process of the present invention, on the other hand, provides more precise control over any processes that may be carried out within the chamber. In comparison to prior art constructions, semiconductor wafers and semiconductor devices can be more precisely processed for providing higher quality products with smaller dimensions, which provides a direct payoff in the computing speed of the finished microchip.

Figure 2:
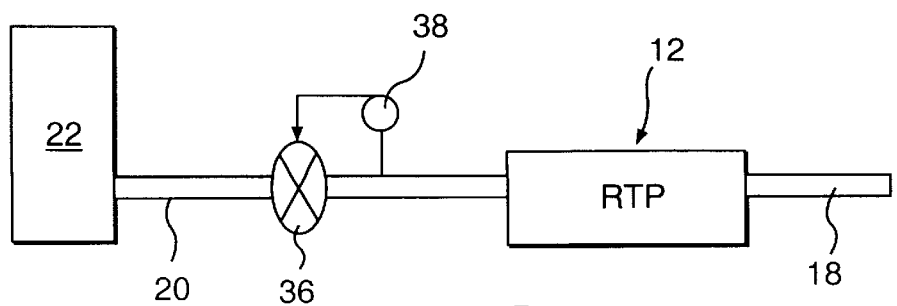
FIG. 2 is a diagrammatical view of the embodiment illustrated in FIG. 1.

Referring to FIGS. 1 and 2, one embodiment of a system for carrying out the process of the present invention is illustrated. As shown particularly in FIG. 1, the system of the present invention includes a thermal processing chamber generally 12 adapted to receive substrates, such as a semiconductor wafer 14, for conducting various processes. In particular, thermal processing chamber 12 is designed to heat wafer 14 at very rapid rates and under carefully controlled conditions. Semiconductor wafers are loaded into and out of chamber 12 through a door 16.

Thermal processing chamber 12 can be made from various materials including metals and ceramics. For instance, chamber 12, in one embodiment, can be made from stainless steel. When chamber 12, however, is made from a heat conductive material, preferably the chamber includes a cooling system. For instance, chamber 12 can include a cooling conduit (not shown) wrapped around the perimeter of the chamber for circulating a cooling fluid, such as water, which is used to cool the chamber during operation.

As shown, thermal processing chamber 12 includes a gas inlet 18 and a gas outlet 20 for introducing and circulating a gas into the chamber. As shown in FIG. 2, gas outlet 20, in turn, can be connected to an exhaust system 22 for processing, disposing of, or recycling any gases flowing through the chamber.

For instance, as described above, a gas, such as an inert gas, can be introduced into thermal processing chamber 12 through gas inlet 18 for preventing and inhibiting any adverse chemical reactions from occurring within the chamber. The inert gas, for instance, can be nitrogen.

In an alternative embodiment, a gas can be introduced into thermal processing chamber 12 that contains a gaseous reactant. The gaseous reactant can be designed to react with semiconductor wafer 14 for depositing a film or coating on the surface of the wafer. For instance, a gas containing titanium or cobalt can be introduced into the chamber for reaction with a silicon wafer in fabricating a semiconductor device.

As shown, wafer 14 is positioned within thermal processing chamber 12 on a substrate holder 24. During processing, substrate holder 24, in one embodiment, can be adapted to rotate wafer 14. Rotating the wafer promotes greater temperature uniformity over the surface of the wafer and promotes enhanced contact between wafer 14 and any gases introduced into the chamber. It should be understood, however, that besides the size wafers, thermal processing chamber 12 is also adapted to process optical parts, films, fibers, ribbons and other substrates having any particular shape.

In order to heat wafer 14, the system of the present invention includes a heat source in communication with thermal processing chamber 12. In the embodiment illustrated in FIG. 1, the heat source comprises a plurality of lamps 26, such as tungsten-halogen lamps, positioned below and above wafer 14. If desired, lamps 26 can be surrounded by a reflector or a set of reflectors for carefully directing thermal energy being emitted by the lamps onto wafer 14 at particular locations. Besides being placed above and below wafer 14, lamps 26 may be placed at any particular location. Further, additional lamps could be included within the system if desired.

The use of lamps 26 as a heat source is generally preferred. For instance, lamps have much higher heating and cooling rates than other heating devices, such as electrical elements or conventional furnaces. Lamps 26 create a rapid thermal processing system that provides instantaneous energy, typically requiring a very short and well controlled start up period. The flow of energy from lamps 26 can also be abruptly stopped at any time. Lamps 26 can be equipped with a gradual power controller that can be used to increase or decrease the thermal energy being emitted by the lamps.

In order to monitor the temperature of wafer 14 during operation of chamber 12, a radiation sensing device 28 is included in communication with chamber 12. Radiation sensing device 28, which can be, for instance, a pyrometer, includes an optical fiber or light pipe 30 which extends from radiation sensing device 28 adjacent to wafer 14.

Light pipe 30 is configured to receive thermal energy being emitted by wafer 14 at a particular wavelength. The amount of sensed radiation is then communicated to radiation sensing device 28 which generates a usable voltage signal for determining the temperature of the wafer. In particular, by knowing the amount of thermal radiation being emitted by wafer 14 at a particular wavelength, the temperature of the object can be calculated based, in part, on Planck's Law.

During the process, light pipe 30 should only detect thermal radiation being emitted by wafer 14 and should be prevented from detecting thermal radiation being emitted by lamps 26 at the desired wavelength. In this regard, thermal processing chamber 12 includes spectral filters 32 and 34 which are positioned between lamps 26 and the end of light pipe 30. Spectral filters 32 and 34 are designed to filter out thermal radiation being emitted by lamps 26 which is at the wavelength at which radiation sensing device 28 operates.

For instance, in one embodiment, spectral filters 32 and 34 are made from fused silica or quartz. Fused silica is known to absorb thermal radiation very effectively at selected wavelengths. For instance, fused silica is very effective at absorbing light at a wavelength of approximately 2.7 microns, at approximately 4.5 microns, and at wavelengths equal to or greater than 5 microns. At all other wavelengths fused silica is substantially transparent. Thus, in one embodiment, when spectral filters 32 and 34 are made from fused silica, radiation sensing device 28 can be configured to detect thermal radiation being emitted by wafer 14 at one of the above described wavelengths.

In accordance with the present invention, in order to precisely control pressure within thermal processing chamber 12, the system further includes a pressure control device 36, which, in this embodiment, is in communication with gas outlet 20. Pressure control device 36, which can be, for example, a throttle valve, is designed to maintain the pressure within chamber 12 at a level slightly greater or slightly less than the pressure of the outside atmosphere. For instance, in one embodiment, in order to prevent gases from leaking into the chamber, pressure control device 36 can be used to maintain the pressure within the chamber at a level slightly greater than atmospheric pressure. Alternatively, in order to prevent gases from leaking out of chamber 12, pressure control device 36 can be used to maintain pressure within the chamber at a level slightly less than atmospheric pressure.

In the past, pressure control devices have been placed in communication with thermal processing chambers for controlling pressure within the chamber. For instance, such an apparatus is disclosed in U.S. Pat. No. 5,443,997 to Tsui, et al. In Tsui, et al, however, the processing chamber disclosed therein does not operate at or near atmospheric pressure. The pressure control device, instead, is used to maintain a vacuum within the chamber. As such, Tsui, et al fails to disclose or suggest carefully controlling the pressure within thermal processing chambers that operate at or near atmospheric pressure and fails to disclose or suggest a process for preventing gases from either leaking into or out of such chambers. In fact, many processes to be carried out in atmospheric processing chambers are not well adapted to being operated under a vacuum.

Referring to the Figures, in one preferred embodiment of the present invention, the pressure within thermal processing chamber 12 is automatically maintained within a desired range during operation of the chamber. In this embodiment, pressure control device 36 can include a pressure gauge 38 which is designed to continuously monitor the pressure within chamber 12. Pressure gauge 38 is in communication with a controller 40, such as a microprocessor. Controller 40 is configured to receive pressure information from pressure gauge 38 and, based on such information, automatically control pressure control device 36 for maintaining the pressure within chamber 12 within a desired range.

In this embodiment, controller 40 can automatically sense any pressure fluctuations that are occurring within chamber 12 due to the flow rate of gases through chamber 12, due to circumstances within exhaust system 22, or due to any other event. Based upon these pressure fluctuations, controller 40 can then adjust pressure control device 36 in order to maintain a desired pressure. As described above, according to the process of the present invention, the pressure within chamber 12 is maintained at levels either slightly greater than atmospheric pressure or slightly less than atmospheric pressure. In the arrangement shown in FIG. 1, the system is particularly well adapted to maintain pressure within the chamber at levels of greater or less than 5 mm Hg in relation to atmospheric pressure.

In another embodiment of the present invention, if desired, the system can further include a warning system that is activated when the pressure in the chamber exceeds a preset limit. For instance, should the exhaust system connected to thermal processing chamber 12 break down, pressures may begin to build up within the chamber which, during some applications, may adversely interfere with the operation of the chamber or may create a dangerous situation. In this regard, the system of the present invention can be programmed to automatically shut down the process or to activate a warning light or buzzer should the pressures within the chamber exceed a preset limit. Similar control devices can also be installed on the chamber for also indicating when pressures within the chamber are below a preset limit.

The present invention may be better understood with reference to the following example.

EXAMPLE

The following test was performed in order to demonstrate the effectiveness of the process of the present invention in preventing atmospheric gases from leaking into a thermal processing chamber that is designed to operate at or near atmospheric pressure.

A thermal processing chamber similar to the one illustrated in FIG. 1 was operated without any pressure controls and then, for comparative purposes, was operated such that the pressure within the chamber was maintained at a level that is 0.5 mm Hg greater than the atmospheric pressure and at a level that is 1.5 mm Hg greater than the atmospheric pressure. Oxygen concentration was monitored within the chamber during the test. Any oxygen detected in the chamber was due to atmospheric oxygen leaking into the chamber.

Without controlling the pressure within the chamber, the oxygen concentration was found to be 48,000 ppm. When, according to the present invention, the pressure within the chamber was maintained slightly below atmospheric pressure, the oxygen concentration then decreased to less than 15 ppm. It was also discovered that maintaining the pressure at 1.5 mm Hg greater than atmospheric pressure only gave slightly better results than maintaining the pressure within the chamber at a level of only 0.5 mm Hg greater than atmospheric pressure.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for preventing atmospheric gases from leaking into a thermal processing chamber, said process comprising the steps of:
    providing a thermal processing chamber for heat treating semiconductor wafers, said thermal processing chamber including a gas inlet and a gas outlet;
    placing a semiconductor wafer in said thermal processing chamber;
    subjecting said semiconductor wafer to light energy for heating said wafer;
    continuously flowing a gas through said thermal processing chamber, said gas entering said gas inlet and exiting said gas outlet; and
    maintaining a pressure within said thermal processing chamber that is greater than the pressure of the atmosphere outside said thermal processing chamber for preventing atmospheric gases from leaking into said chamber, said pressure within said thermal processing chamber being from about 0.5 mm Hg to about 5 mm Hg greater than said atmospheric pressure.

2. A process as defined in claim 1, wherein said thermal processing chamber is maintained at a pressure of from about 0.5 mm Hg to about 3 mm Hg greater than said atmospheric pressure.

3. A process as defined in claim 1, wherein said thermal processing chamber is maintained at a pressure of from about 0.5 mm Hg to about 1.5 mm Hg greater than said atmospheric pressure.

4. A process as defined in claim 1, wherein said thermal processing chamber includes a pressure control device in communication with said gas outlet for controlling said pressure within said chamber.

5. A process as defined in claim 4, wherein said pressure control device is in communication with a pressure gage and a controller, said controller receiving pressure information from said pressure gage and, based on said information, adjusting said pressure control device for controlling said pressure within said thermal processing chamber.

6. A process as defined in claim 5, wherein said controller comprises a microprocessor.

7. A process as defined in claim 1, wherein said gas flowing through said thermal processing chamber is an inert gas.

8. A process as defined in claim 7, wherein said inert gas comprises nitrogen.

9. A process as defined in claim 1, wherein said gas that flows through said thermal processing chamber contains a gaseous reactant that reacts with said semiconductor wafer.

10. A process for preventing atmospheric gases from leaking into a thermal processing chamber during the processing of semiconductor wafers, said process comprising the steps of:
    providing a thermal processing chamber for heat treating semiconductor wafers, said thermal processing chamber including a gas inlet and a gas outlet, said gas outlet being in communication with a pressure control device;
    placing a semiconductor wafer in said thermal processing chamber;
    subjecting said semiconductor wafer to light energy for heating said wafer;
    continuously flowing a gas through said thermal processing chamber, said gas entering said gas inlet and exiting said gas outlet; and
    controlling said pressure control device for maintaining a pressure within said thermal processing chamber that is greater than the pressure of the atmosphere outside said thermal processing chamber, said pressure within said chamber being from about 0.5 mm Hg to about 5 mm Hg greater than said atmospheric pressure.

11. A process as defined in claim 10, wherein said pressure control device is controlled such that said pressure within said thermal processing chamber is maintained in an amount from about 0.5 mm to about 3.0 mm Hg greater than said atmospheric pressure.

12. A process as defined in claim 10, herein said pressure control device is controlled such that said pressure within said thermal processing chamber is maintained in an amount from about 0.5 mm Hg to about 1.5 mm Hg greater than said atmospheric pressure.

13. A process as defined in claim 10, wherein said thermal processing chamber further includes a pressure indicating apparatus in communication with a controller, said controller being configured to automatically control said pressure control device based on information received from said pressure indicating apparatus.

14. A process as defined in claim 13, wherein said pressure control device comprises a throttle valve.

15. A process as defined in claim 13, wherein said controller comprises a microprocessor.

16. A process as defined in claim 10, wherein said gas flowing through said thermal processing chamber is an inert gas.

17. A process as defined in claim 10, wherein said gas flowing through said thermal processing chamber contains a gaseous reactant, said gaseous reactant reacting with said semiconductor wafer.

18. A process for preventing gases from escaping from a thermal processing chamber, said process comprising the steps of:

providing a thermal processing chamber for heat treating and semiconductor wafers, said thermal processing chamber including a gas inlet and a gas outlet;

placing a semiconductor wafer in said thermal processing chamber;

subjecting said semiconductor wafer to light energy for heating said wafer;

continuously flowing a gas through said thermal processing chamber, said gas entering said gas inlet and exiting said gas outlet; and maintaining a pressure within said thermal processing chamber that is less than the pressure of the atmosphere outside said chamber for preventing said gas flowing through said chamber from leaking out of said chamber, said pressure within said thermal processing chamber being maintained in an amount of from about 0.5 mm Hg to about 5 mm Hg less than said atmospheric pressure.

19. A process as defined in claim 18, wherein said pressure within said thermal processing chamber is maintained within a range of from about 0.5 mm Hg to about 3.0 mm Hg less than said atmospheric pressure.

20. A process as defined in claim 18, wherein said gas flowing through said thermal processing chamber contains a gaseous reactant that reacts with said semiconductor wafer.

21. A process as defined in claim 18, wherein said thermal processing chamber further comprises a pressure control device in communication with said gas outlet, and wherein said pressure in said thermal processing chamber is maintained below said atmospheric pressure by adjusting said pressure control device.

22. A process for preventing gases from escaping from a thermal processing chamber, said process comprising the steps of:

providing a thermal processing chamber for heat treating semiconductor wafers, said thermal processing chamber including a gas inlet and a gas outlet, said gas outlet being in communication with a pressure control device;

placing a semiconductor wafer in said thermal processing chamber;

subjecting said semiconductor wafer to light energy for heating said wafer;

continuously flowing a gas through said thermal processing chamber, said gas entering said gas inlet and exiting said gas outlet;

controlling said pressure control device for maintaining a pressure within said thermal processing chamber that is less than the pressure of the atmosphere outside said thermal processing chamber, said pressure within said chamber being from about 0.5 mm Hg to about 5 mm Hg less than said atmospheric pressure.

23. A process as defined in claim 22, wherein said pressure control device is controlled such that said pressure within said thermal processing chamber is maintained in an amount from about 0.5 mm Hg to about 3.0 mm Hg less than said atmospheric pressure.

24. A process as defined in claim 22, wherein said pressure control device is controlled such that said pressure within said thermal processing chamber is maintained in an amount from about 0.5 mm Hg to about 1.5 mm Hg less than said atmospheric pressure.

25. A process as defined in claim 22, wherein said thermal processing chamber further includes a pressure indicating apparatus in communication with a controller, said controller being configured to automatically control said pressure control device based on information received from said pressure indicating apparatus.

26. A process as defined in claim 25, wherein said controller comprises a microprocessor.

* * * * *